United States Patent [19]

Lampel

[11] Patent Number: 5,394,115
[45] Date of Patent: Feb. 28, 1995

[54] AUTOMATIC SWEEP ACQUISITION CIRCUIT FOR A PHASE-LOCKED-LOOP

[75] Inventor: Geoffrey A. Lampel, Burlington, Iowa

[73] Assignee: Conifer Corporation, Burlington, Iowa

[21] Appl. No.: 221,487

[22] Filed: Apr. 1, 1994

[51] Int. Cl.[6] .............................................. H03L 7/12
[52] U.S. Cl. .......................................... 331/4; 331/17; 331/DIG. 2
[58] Field of Search ................... 331/4, 8, 15, 16, 17, 331/23, 25, DIG. 2

[56] References Cited

U.S. PATENT DOCUMENTS

| | | | |
|---|---|---|---|
| 4,344,041 | 8/1982 | Maine | 375/87 X |
| 4,473,805 | 9/1984 | Guhn | 331/1 A |
| 4,486,717 | 12/1984 | Yamasaki | 331/4 |
| 5,091,702 | 2/1992 | Foell | 331/4 |
| 5,148,123 | 9/1992 | Ries | 331/4 |

*Primary Examiner*—David Mis
*Attorney, Agent, or Firm*—Dorr, Carson, Sloan & Peterson

[57] ABSTRACT

An automatic sweep acquisition circuit for a phase-locked-loop using a positive feedback network coupled between a non-inverting input of an operational amplifier and an output of the operational amplifier is provided. The operational amplifier serves as a loop filter for the PLL and has a negative feedback network configured as a lead-lag integrator. The positive feedback network forms a Wein-bridge oscillator that automatically oscillates at a predetermined frequency when phase lock does not exist. A negative feedback path also supplies a portion of the phase shift required to activate the Wein bridge oscillator in order to provide sweep acquisition. When the circuit operates within the bandwidth of the PLL or within the lock-in range of the PLL the positive feedback network provides minimal feedback and thus creates no oscillation or sweeping voltage. The locked-in range of the PLL is increased to the pull-in range of the voltage controlled oscillator used in the phase-locked loop.

11 Claims, 4 Drawing Sheets

AUTOMATIC SWEEP ACQUISITION CIRCUIT FOR A PHASE-LOCKED-LOOP

BACKGROUND OF THE INVENTION

1. Field of the Invention

The present invention relates, in general, to phase-locked-loops and, more particularly, to a phase-locked-loop having automatic sweep acquisition circuitry.

2. Statement of the problem

Phase-locked-loops are widely used in electronic circuitry in applications such as satellite communications, navigation systems, and FM communications. Phase-locked-loops provide functions such as phase detection, frequency modulation and demodulation, frequency division and multiplication, filtering, and oscillator stabilization.

In operation, phase-locked-loops (PLLs) compare the output frequency of a voltage control oscillator (VCO) with a reference signal. If the two signals differ in frequency and/or phase, an error voltage is generated and applied to the VCO, causing it to correct in the direction required for decreasing the difference. The correction procedure continues until "phase-lock" is achieved, after which the VCO will continue to track the incoming signal as long as it remains within the "hold-in" range of the PLL.

The lock-in or pull-in range of range of a phase-locked-loop is that range of frequencies, above and below the correct phase locked frequency, where self acquisition to phase lock is internal to the loop. When the absolute value of the frequency difference is greater than the PLL's bandwidth the circuit cannot acquire phase lock.

Typically, such a circuit may employ a sweep acquisition aid to extend the pull-in range. When and XOR gate is used, the phase detector generates a phase error signal that is a series of pulses. The duty cycle of the phase error signal indicates the degree of phase or frequency offset between the reference signal and the output of the VCO.

The phase error signal also includes a significant noise component caused by practical limitations in the circuitry used. The phase error signal is passed through a "loop filter" that removes the noise component. In the case of a digital phase detector, the loop filter must also integrate the phase error signal to change it from a series of pulses to a direct current (DC) voltage. The DC voltage then drives the voltage controlled oscillator.

The loop filter is conventionally realized as an operational amplifier configured as a lead-lag integrator or similar integrating circuit. Thus, the loop filter typically uses only negative feedback in conventional PLL's.

In order to increase the pull-in range of the PLL beyond that of the PLL bandwidth, additional circuitry must be provided to cause a "sweeping voltage" to the input of the VCO which passes the VCO through the natural "lock-in" range. Typically this is accomplished by circuitry that 1) detects when a phase lock condition does or does not exist and 2) provides a ramped voltage to the input of the for sweep acquisition. Alternatively, the ramped voltage may be applied to the input of the loop filter.

Although the additional circuitry works well to increase the pull-in range of frequencies within which the PLL can lock, it is expensive and increases the overall size of the PLL. Moreover, the circuitry required to detect phase lock and switch the sweep circuitry on and off often requires control logic such as a microprocessor that greatly increases complexity and cost of the PLL. The additional circuitry also adds noise to the PLL that, when amplified by the loop filter, reduces overall stability of the output from the VCO.

A further disadvantage of known phase-lock-loops is that functions such as sweep acquisition, lock detection, and sweep termination must be provided by auxiliary circuitry such as lock detectors, sweep generators, discriminators, and microprocessors that add complexity and cost to the system. The additional circuitry may be more complex and may consume more space, power, etc., than the basic loop itself.

Accordingly, a need exists for a phase-locked loop with an automatic sweep acquisition capability. A need also exists for sweep acquisition circuitry for phase-locked loops that requires little auxiliary circuitry while at the same time rapidly achieving phase-lock. An automatic sweep acquisition circuit is also needed that is simple, economical and consumes little power.

Solution to the Problem

The present invention provides a solution to the above mentioned problems by providing a sweep acquisition circuit for a phase-locked-loop that is integrated with existing circuitry in conventional phase-locked-loops. By using a small number of passive components selected to be compatible with the necessary functions of the phase-locked-loop, the phase-locked-loop can be made to automatically acquire phase-lock through external sweep acquisition.

SUMMARY OF THE INVENTION

Briefly stated, the present invention provides a sweep acquisition circuit for a phase-locked-loop using the positive feedback network coupled between a non-inverting input of an operational amplifier and the output of the operational amplifier. The operational amplifier serves as a loop filter for the PLL and has a negative feedback network configured as a lead-lag integrator. The positive feedback network forms a Wein-bridge sweep acquisition oscillator that oscillates in conjunction with the phase shift from the negative feedback network when phase lock does not exist. When the circuit operates within the bandwidth of the PLL or within the lock in range of the PLL the positive feedback network provides minimal overall feedback and thus creates no apparent oscillation or sweeping voltage. Thus, with little auxiliary circuitry, and only passive components in the positive feedback network, the locked in range of the PLL is increased from the bandwidth of the PLL to the bandwidth of the voltage controlled oscillator used in the PLL.

DETAILED DESCRIPTION OF THE DRAWING

1. Overview

Figure 1:
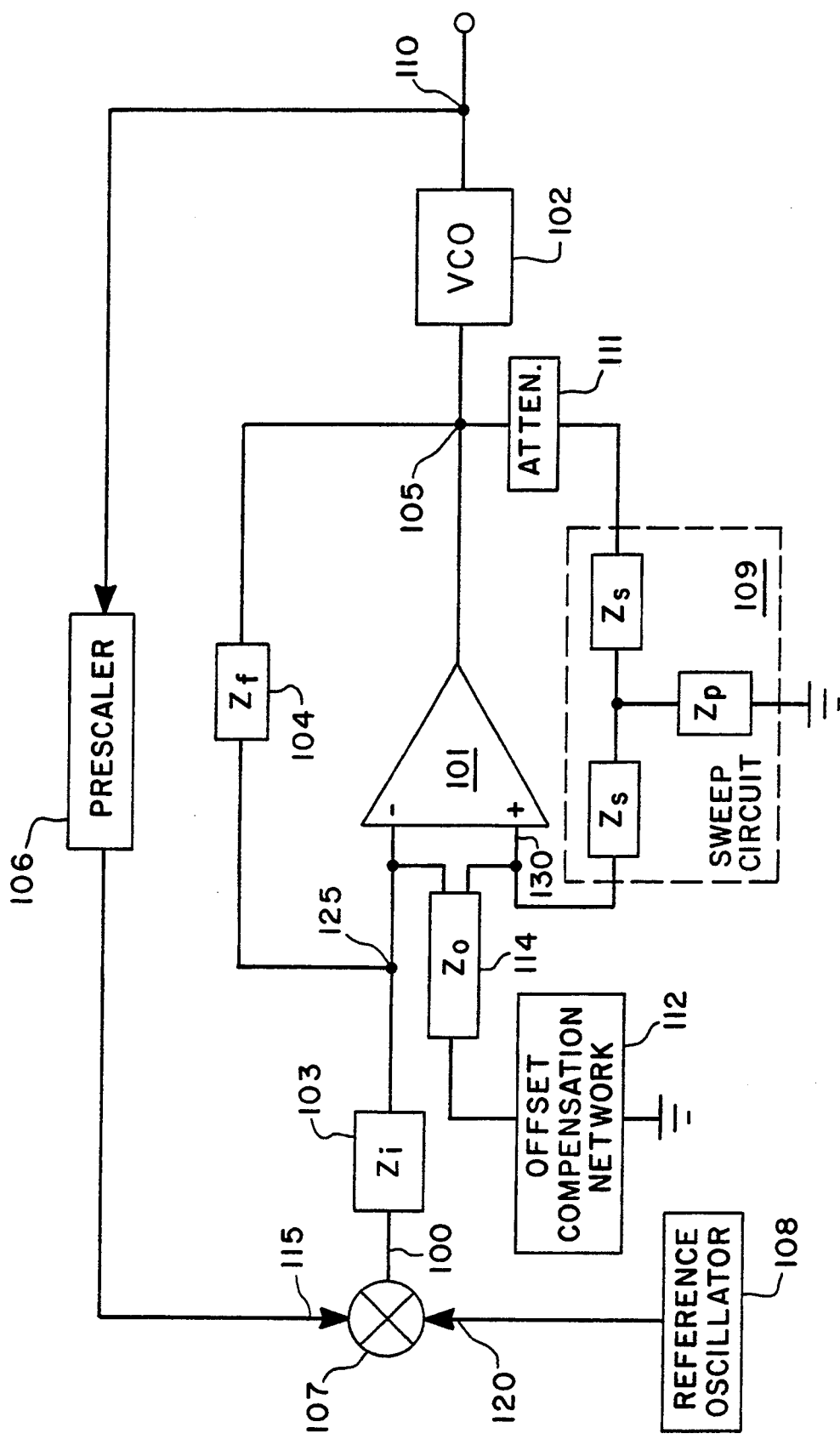
FIG. 1 is a block diagram schematic of a phase-locked-loop incorporating automatic sweep acquisition circuitry in accordance with the present invention.

FIG. 1 illustrates a phase-lock loop (PLL) in accordance with the present invention. The PLL in accordance with the present invention is preferably a "tracking loop" in which the signal of output on line 115 is substantially equal to the frequency of the reference signal provided by reference oscillator 108. It should be understood that variations on the basic PLL structure shown in FIG. 1 are possible and equally useful with an automatic sweep acquisition circuit 109 in accordance with the present invention.

Essentially, the PLL in accordance with the present invention operates to provide an output signal on line 110 having a stable frequency. As is done in conventional PLLs, the output signal is fed back to an input of a phase detector 107. Phase detector 107 compares the phase and/or frequency of the output signal to a reference signal provided by a reference oscillator. Phase detector 107 generates a phase error signal on node 100 that is proportional to the phase difference between the signals on line 115 and line 120.

The phase error signal on node 100 is processed by a loop filter to provide a filtered phase error signal on node 105. Node 105 is coupled to the input of a voltage controlled oscillator (VCO) 102. VCO 102 translates the filtered phase error signal on node 105 into an output signal having the desired oscillation frequency.

In the preferred embodiment phase detector 107 is an exclusive or (XOR) logic gate. Any family of logic may be used including CMOS, TTL, ECL and the like. An exclusive or logic gate produces an output having a first logic value (i.e., logic "LOW") when inputs 115 and 120 have the same logic value, and produces a second logic value (i.e., logic "HIGH") when inputs 115 and 120 differ from each other. The use of exclusive-or logic gates as phase detectors is well known to those familiar with the design of phase lock to loops.

The phase error signal on a node 100 is thus a series of pulses. The duty cycle of the phase error signal on node 100 is proportional to the phase difference between the signals on line 115 and line 120. Operational amplifier 101 together with feedback impedance 104 ($Z_f$ in FIG. 1) and input impedance 103 ($Z_i$ in FIG. 1) form a loop filter for the PLL. In the preferred embodiment, feedback impedance 104 and input impedance 103 are chosen so that the loop filter is an integrating loop filter. This can be accomplished by configuring feedback impedance 104 and input impedance 103 and operational amplifier 101 as a lead-lag integrator. An integrating loop filter integrates the series of pulses on node 100 to produce a filtered phase error signal on node 105 that is substantially DC.

It should be understood that although integrating loop filters and lead-lag integrators are well known, the particular components chosen for feedback impedance 104 and input impedance 103 are modified from conventional filters to provide proper phase shift for the automatic sweep acquisition circuitry of the present invention. These features of the present invention will be described in greater detail hereinafter.

It is important to note that the integrating loop filter implemented by feedback impedance 104 provides somewhat less than ninety degrees phase shift. Actual phase shift is estimated at about eighty-five to eighty-nine degrees due to a real component of resistance that is inherent in any real capacitive components (such as capacitor 207 shown in FIG. 2). The analytic proof that the phase-lock loop in accordance with the present invention will operate requires that one recognize this feature of real capacitive components. Likewise, it is important to understand this concept to model and adapt the present invention to a particular application.

The output of VCO 102 can be coupled from line 110 directly to the input 115 of phase detector 107. Alternatively, when the frequency of the output signal from VCO 102 is higher than can be easily detected by phase detector 107, prescaler 106 can be used to divide the output frequency on 110 to produce a lower frequency divided output signal on line 115. Prescalers suitable for use in prescaler 106 are conventionally available as integrated circuits and divide the output frequency by an integer multiple where the integer is in the range of two to several hundred. The particular choice for VCO 102 and prescaler 106 are a matter of design choice so that the frequency of the output signal on line 110 meets the particular needs of an application.

An important feature of the present invention is a positive feedback network coupled to non-inverting input 130 of operational amplifier 101. The positive feedback network includes an attenuating circuit 111 and a sweep circuit 109. In accordance with the present invention, the positive feedback network continuously couples the filtered phase error signal on node 105 to non-inverting input 130 of operational amplifier 101.

In accordance with the present invention, the particular components chosen for attenuation circuit 111 and sweep circuit 109 are designed to provide significant positive feedback to non-inverting input 130 when the phase-locked-loop is not in a locked condition while providing minimal positive feedback when a phase-lock condition exists.

Sweep circuit 109 together with operational amplifier 101 are configured as a Wein bridge oscillator so that the positive feedback during the non-phase lock condition causes output node 105 to oscillate. Sweep circuit 109 serves to phase shift the output of operational amplifier 101 from node 105. This phase shift, together with the phase shift created by feedback impedance 104, create sufficient phase shift to cause sinusoidal oscillation.

Preferably the oscillation frequency is relatively slow with respect to the loop bandwidth. The oscillating signal created by the positive feedback network causes VCO 102 to sweep through it's entire frequency output range. When VCO 102 is swept into the pull-in range of the PLL, the feedback provided through sweep circuit 109 is automatically reduced so that the negative feedback components dominate and the loop filter begins to act as a conventional integrating loop filter.

Another important feature of the present invention is offset network 112 that is coupled to inverting input 125 and non-inverting input 130 through buffer circuit 114. Offset network 112 serves to provide an offset voltage to compensate for any offset error in phase detector 107. For example, offset error commonly arises when the duty cycle of the input signals on lines 115 and 120 are different. This may be a constant value offset, or may vary with time depending on the particular application. Accordingly, buffer circuit 112 can provide either a constant offset voltage or can be adjusted to provide a variable offset compensation voltage depending on the need of a particular application.

In summary, the phase-locked-loop in accordance with the present invention is configured to operate as a conventional phase-locked-loop having a integrating loop filter when a phase lock condition exists. When a phase-lock condition does not exist and the PLL is operating outside of its lock-in range, sweep circuit 109 automatically provides sweep acquisition with a sinusoidal waveform to acquire phase-lock. The positive feedback is provided until the phase-locked-loop is brought into a pull-in range at which time the loop filter system automatically cancels the positive feedback, causing the PLL to return to conventional phase-lock mode operation.

2. Details of Integrating Loop Filter Circuit

In order to better understand the PLL in accordance with the present invention, the negative feedback circuit that provides the integrating loop filter is described separately from the positive feedback network that provides the automatic sweep acquisition function. It should be understood that in reality these circuits do interact. The particular components and configurations for the impedance networks illustrated in FIG. 2, FIG. 3 and FIG. 4 take into account these interactions and so can be relied upon to adapt the particular embodiment disclosed to specific needs of a particular application.

Figure 2:
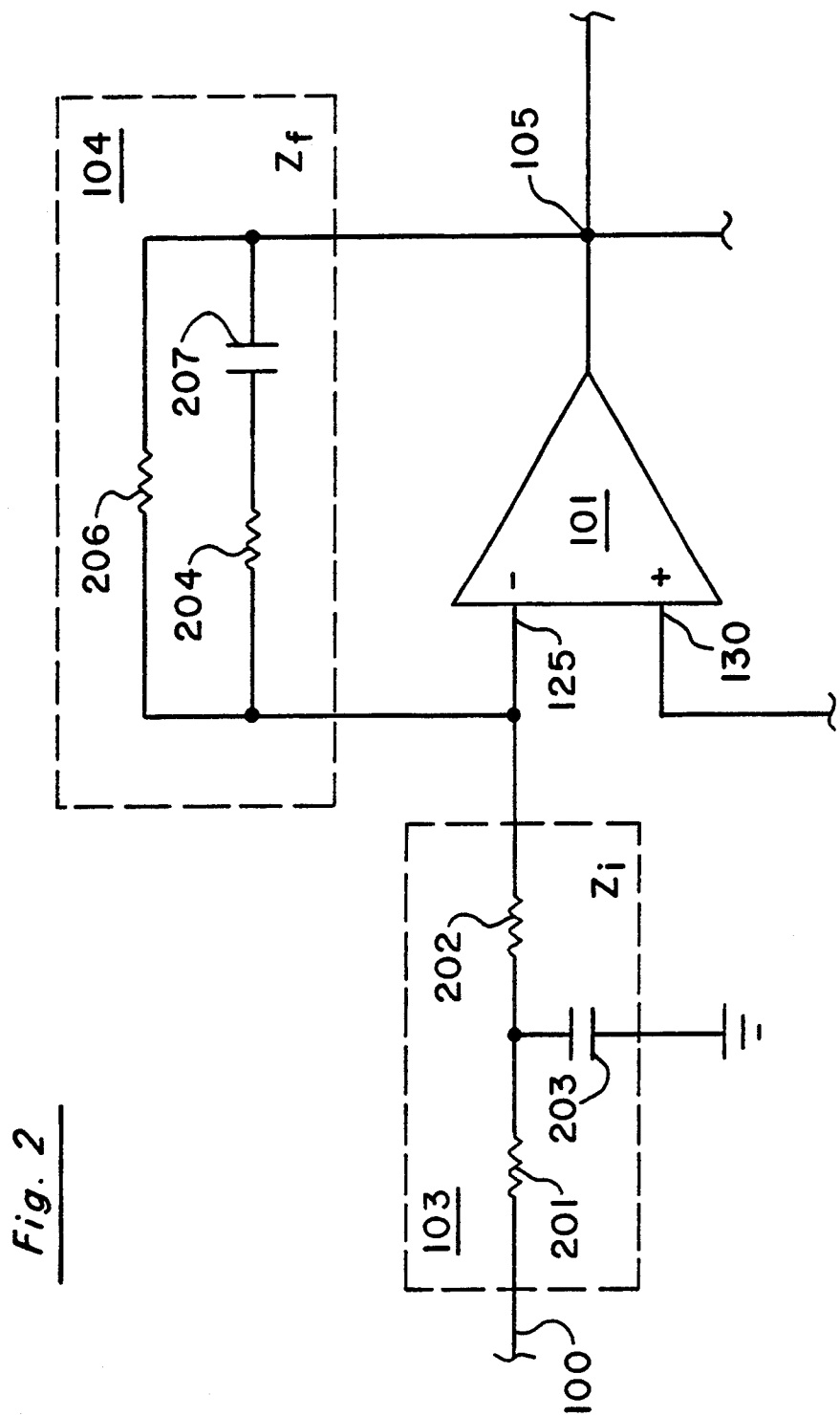
FIG. 2 illustrates in schematic form the negative feedback network in accordance with the present invention.

As shown in FIG. 2 feedback impedance 104 is preferably formed by a network including resistor 204 in series with capacitor 207. Optionally, a resistor 206 can be provided in parallel with the combination of resistor 204 and capacitor 207. Feedback impedance 104 is coupled between node 105, which is the output of operational amplifier 101, and node 125 which is the inverting input of operational amplifier 101.

Input impedance $Z_i$ is formed by a network of two resistors 201 and 202 and one capacitor 203. Resistor 201 has one terminal coupled to node 100, which is the output of phase detector 107 shown in FIG. 1. The other terminal of resistor 201 is coupled to one end of resistor 202 and one end of capacitor 203. The other end of capacitor 203 is coupled to ground or common potential. The other end of resistor 202 is coupled to node 125 which is the inverting input to operational amplifier 101. The loop gain of the circuit shown in FIG. 2 is $Z_f/Z_i$, as is well known.

The particular components chosen for feedback impedance 104 and input impedance 103 must be selected to provide an acceptable amount of phase shift to inverting input 125 at the predetermined oscillation frequency. The amount of phase shift at the predetermined sweep frequency can be calculated using conventional circuit analysis techniques and it is important only to know that this phase shift must be accounted for when designing the positive feedback network.

3. Detail of Positive Feedback Network

Figure 3:
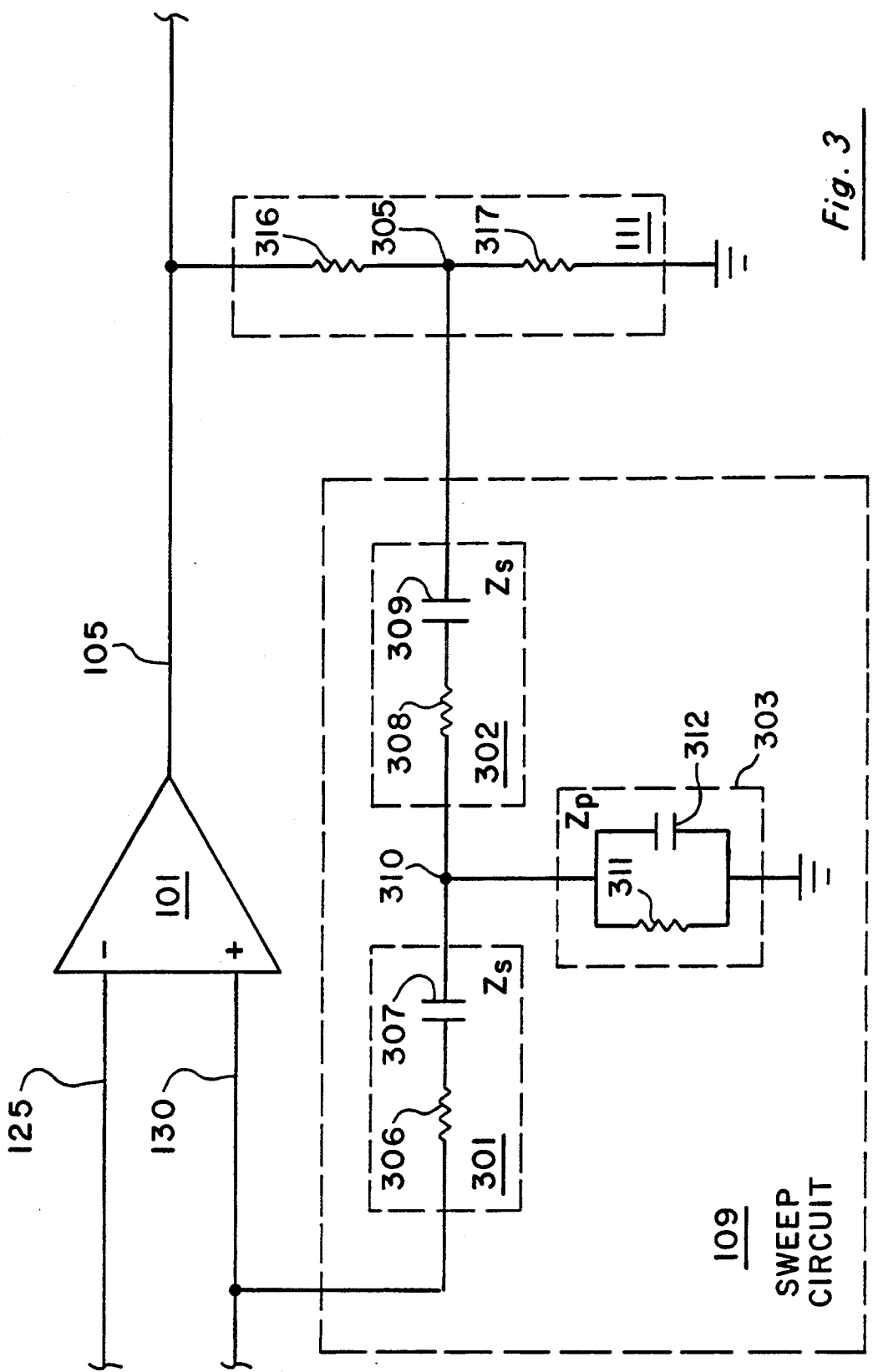
FIG. 3 illustrates in schematic form of the positive feedback network of the PLL shown in FIG. 1.

FIG. 3 illustrates in schematic form the positive feedback network shown in FIG. 1 illustrating the circuit details of attenuation circuit 111 and sweep circuit 109. The attenuation circuit 111 is most simply formed by a resistive voltage divider network including resistors 317 and 316. As is well known, the voltage of the nodes joining resistors 317 and 316 will be a fraction of the voltage on node 105 determined by the ratio of resistor 317 to resistor 316. For purposes of discussion, attenuation circuit 111 provides an attenuation of factor k so that the voltage at node 305 is equal to the voltage at node 105 multiplied by k.

Node 305 of attenuation circuit 111 is coupled to sweep circuit 109. Sweep circuit 109 is configured as a Wein bridge oscillator comprising three impedance networks. Three impedance networks $Z_S$, $Z_P$, $Z_S$ in FIG. 3 form sweep circuit 109 and are designed to provide minimal parasitic interaction between inverting node 125 and non-inverting node 130.

Sweep circuit 109 has a characteristic transfer function from node 305 to non-inverting input 130 that for convenience is called $\beta$. Taking into account the effect of attenuation circuit 111, the transfer function from node 105 to non-inverting input 130 is represented by $k*\beta$. The voltage at node 130, which is necessary to calculate the loop gain of the automatic sweep acquisition loop filter of the present invention, is found by the equation $v_{130}=v_o k\beta$ where $V_o$ is the voltage at node 105.

In a preferred embodiment each impedance network in sweep circuit 109 provides approximately 60 degrees phase shift to the positive feedback signal at the predetermined sweep frequency. Also, in the preferred embodiment first series impedance network 301 is substantially the same as second series impedance network 302. All of the components can be selected using conventional network analysis techniques used for Wein bridge oscillator circuits.

In operation, the positive feedback network provides a positive feedback signal on non-inverting input 130 that is substantially 180 degrees out of phase with signal on inverting input 125 at the predetermined sweep frequency. At the pre-determined sweep frequency, the magnitude of the positive feedback signal ($k\beta$) is designed such that the loop gain, including both the negative feedback network shown in FIG. 2 and the positive feedback network shown in FIG. 3, satisfies the Barkhausen condition.

Although the derivation is not necessary for a complete understanding of the present invention, it $$v_o = \frac{\frac{Z_f}{Z_i} v_{125}}{1 + \frac{Z_f}{Z_i} k\beta}$$

can be shown that the loop gain of the circuit shown in FIG. 1 is:

The Barkhausen condition is satisfied when the denominator of the loop gain equation is zero, which occurs when $(Z_f/Z_i)k\beta=-1$. When that condition is satisfied the Wein bridge oscillator formed by operational amplifier 101 and sweep circuit 109 will begin to sinusoidally oscillate at the predetermined sweep frequency.

The components of sweep circuit 109 and attenuation circuit 111 are also chosen to provide minimal feedback when a phase lock condition exists. When a phase lock condition exists, the open loop transfer function shown in FIG. 1, changes modes and becomes a closed loop transfer function. Overall circuit gain drops to unity and the Barkhausen conditions are quenched by the loop filter and sweep acquisition ceases until the closed loop transfer exceeds the hold-in range, causing loss in phase lock.

4. Details of Offset Compensation Network

Figure 4:
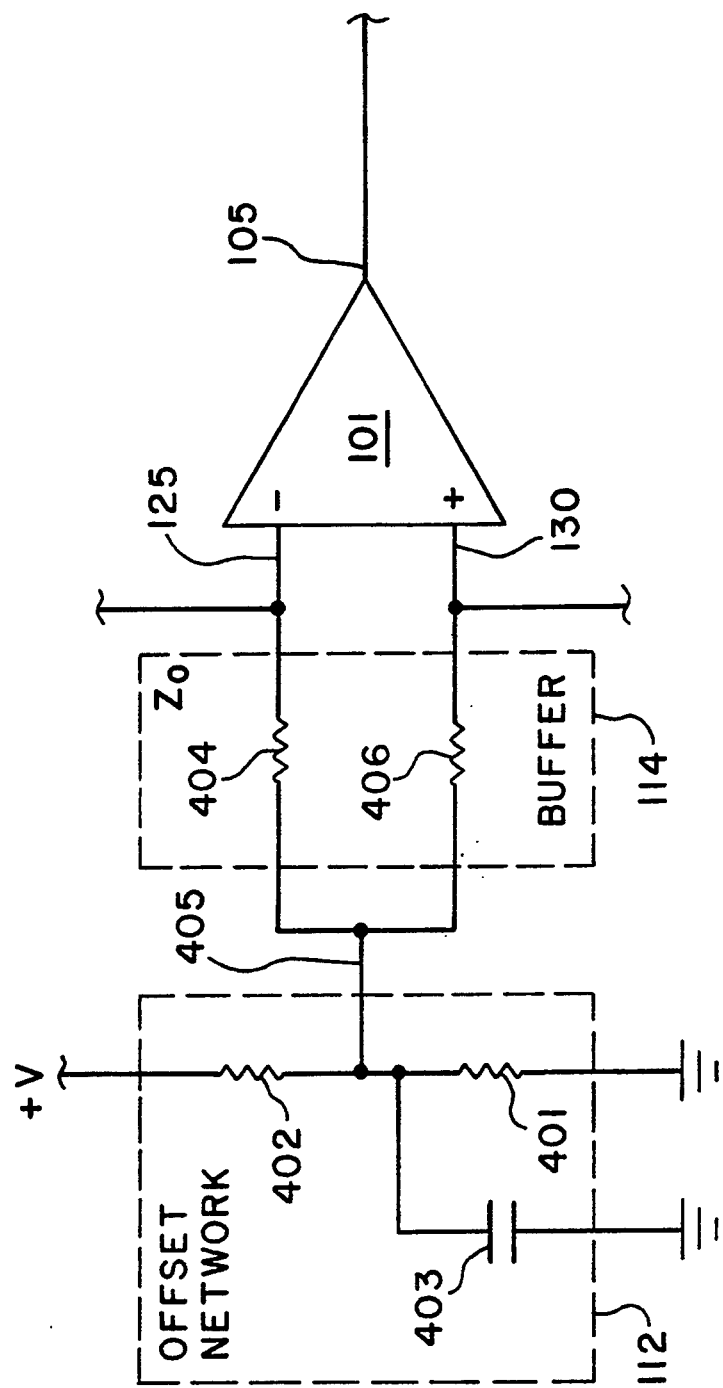
FIG. 4 illustrates in schematic form the offset circuitry of the phase-locked-loop shown in FIG. 1.

As shown in FIG. 4, offset compensation network 112 is coupled to operational amplifier 101 through offset impedance network 114, labeled $Z_o$ in FIG. 4 and FIG. 1. In it's simplest form, offset compensation network 112 is a voltage divider network that provides a reference voltage at node 405. As shown in FIG. 4, resistors 401 and 402 can be fixed value resistors so that the offset voltage at node 405 is a fixed voltage. Alternatively, a variable resistor or potentiometer can be placed in offset compensation network 112 to provide a variable voltage on node 405.

Capacitor 403 serves as a bypass capacitor to shunt any high-frequency noise to ground. The offset compensation of voltage is coupled through offset impedance network 114 to both the inverting input 125 and non-inverting input 130 of operational amplifier 101. Offset impedance network 114 can be as simple as resistor 404 and resistor 406 that set the DC gain of the positive and negative feedback signals coupled to nodes 125 and 130 from offset network 112.

It should be understood that a variety of offset compensation circuits can be used for offset compensation network 112 and a variety of isolation circuits can be used for offset impedance network 114 in accordance with the present invention and provide suitable performance. Active circuitry can be used to provide an offset compensation voltage on node 405 instead of the passive resistive voltage divider network shown. Likewise, active buffer circuits having high impedance can be used in place of resistors 404 and 406. These and other modifications are within the scope of the present invention.

A useful phase-locked loop circuit having an automatic sweep acquisition circuitry built into the loop filter has been described. Because the loop filter is a necessary component in almost every phase-locked-loop design, no additional active circuitry is required to implement the sweep acquisition circuit in accordance with the present invention. Additionally, the automatic sweep acquisition circuit in accordance with the present invention can be implemented entirely with passive components without additional switches, active circuitry, or logic control circuitry. Sweep circuit 109 is provided with a three stage impedance network, but it is known to use two or more stages to provide the phase shift and positive feedback characteristics described herein. Accordingly, these and other modifications are within the spirit and scope of the present invention and are encompassed by the claims.

I claim:

1. A phase-lock loop circuit having a voltage controlled oscillator, a phase detector, and a sweep acquisition circuit, the phase-lock loop comprising:
   an operational amplifier having an inverting input, a non-inverting input, and an output for providing a drive signal to the voltage controlled oscillator;
   a negative feedback network coupled between the output and the inverting input of the operational amplifier;
   a positive feedback network coupled to the non-inverting input of the operational amplifier, and the output of the operational amplifier, wherein the positive feedback network includes means for phase-shifting the attenuated drive signal by an odd multiple of 180 degrees at a predetermined sweep frequency $f_{sw}$.

2. The phase-lock loop circuit of claim 1 wherein at the predetermined sweep frequency the drive signal is a substantially sinusoidal oscillation.

3. The phase-lock loop circuit of claim 1 wherein the positive feedback network causes a substantially 180 degree phase shift.

4. The phase-lock loop circuit of claim 1 wherein the negative feedback network causes the drive signal to be an integral of a signal on the inverting input.

5. The phase-lock loop circuit of claim 1 wherein the phase detector generates an output signal that is coupled to the inverting input of the operational amplifier through an input impedance network.

6. The phase-lock loop circuit of claim 1 wherein the positive feedback network comprises:
   a common node;
   a first series impedance network coupled between the attenuating means and the common node;
   a second series impedance network coupled between the non-inverting input and the common node; and
   a parallel impedance network coupled between the common node and ground potential.

7. The phase-lock loop circuit of claim 6 wherein the first series impedance network and the second series impedance network comprise a resistor electrically connected in series with a capacitor and the parallel impedance comprises a capacitor electrically coupled in parallel with a resistor.

8. The phase-lock loop circuit of claim 1 wherein the positive feedback network is chosen to provide minimal feedback during phase-lock.

9. A phase-locked loop comprising:
   a phase detector having first and second inputs and an output for providing a phase error signal;
   a voltage controlled oscillator having an output coupled to one of the inputs of the phase detector via a prescaler and having an input for receiving a drive voltage;
   a loop filter having an input coupled to the phase detector output and an output coupled to the voltage controlled oscillator input, the loop filter including:
   i) means for integrating the phase error signal and providing the integrated phase error signal on the output to provide a phase-lock condition; and
   ii) means for causing the loop filter output to have a substantially sinusoidal oscillation for a sweep acquisition.

10. The phase-locked loop of claim 9 wherein the loop filter comprises:
    an operational amplifier having an inverting input, a non-inverting input, and an output, the inverting input serving as the input for the loop filter; and
    the means for causing substantially sinusoidal oscillation comprises a positive feedback network coupled between the output of the loop filter and the non-inverting input of the operational amplifier, and a negative feedback network coupled between the output of the loop filter and the inverting input of the operational amplifier, wherein the positive feedback network and negative feedback network together provide sufficient phase shift to cause the sinusoidal oscillation.

11. The phase-locked loop of claim 10 wherein the operational amplifier is configured as an integrator having a feedback impedance $Z_f$ coupled between the op amp output and the inverting input, an input impedance $Z_i$ coupled between the inverting input and the phase detector output.

* * * * *